United States Patent [19]

Homma et al.

[11] Patent Number: 4,790,894
[45] Date of Patent: Dec. 13, 1988

[54] PROCESS FOR PRODUCING PRINTED WIRING BOARD

[75] Inventors: Masaji Homma, Yuki; Hitoshi Yamauchi, Tochigi, both of Japan

[73] Assignee: Hitachi Condenser Co., Ltd., Tokyo, Japan

[21] Appl. No.: 46,515

[22] Filed: May 6, 1987

[30] Foreign Application Priority Data

Feb. 19, 1987 [JP] Japan .................................. 62-36668
Mar. 24, 1987 [JP] Japan .................................. 62-67843

[51] Int. Cl.⁴ ..................... B32B 31/00; B23K 31/02; B23P 17/00
[52] U.S. Cl. ................... 156/250; 228/180.2; 29/423; 29/424; 428/901
[58] Field of Search ...................... 156/250; 228/180.2; 29/423, 424; 428/209, 131, 137, 192, 901

[56] References Cited

U.S. PATENT DOCUMENTS

| | | | |
|---|---|---|---|
| 3,357,099 | 12/1967 | Nagy et al. | 29/424 |
| 4,064,623 | 12/1977 | Moore | 29/424 |
| 4,352,449 | 10/1982 | Hall et al. | 228/180.2 |

FOREIGN PATENT DOCUMENTS 2142568  1/1985  United Kingdom ............ 228/180.2

Primary Examiner—John E. Kittle
Assistant Examiner—P. J. Ryan
Attorney, Agent, or Firm—Antonelli, Terry & Wands

[57] ABSTRACT

A base board having a plurality of semicircular through-holes filled with solder at side walls produced by filling through-holes with solder can be connected electrically to printed circuit boards with large connecting strength and high reliability.

8 Claims, 2 Drawing Sheets

PROCESS FOR PRODUCING PRINTED WIRING BOARD

BACKGROUND OF THE INVENTION

This invention relates to a process for producing a base board having solder-filled semicircular through-holes at side walls.

Printed wiring boards have been produced, as shown in FIG. 7, by placing a base board (or a chip carrier) 3 mounting electronic parts and having a plurality of semicircular through-holes 5 at side walls on lands (or pads) 2 on a printed circuit board 1 and bonding the through-hole portions to the lands by using solder 7. The base board 3 is prepared by forming through-holes 10 in a base sheet 9 as shown in FIG. 5, and cutting the base sheet at a predetermined portion to give a plurality of base boards as shown in FIG. 6 with a predetermined size. The semicircular through-holes 5 at side walls 4 are obtained by forming round through-holes 10 in the base sheet 9, covering each through-hole wall with a copper coating 12 formed by electroless plating, and cutting the base sheet 9 with a cutter along the line 15 (FIG. 5).

But there often take place partial peeling 16 of the copper coating 12 at edge portions of semicircular through-holes 5 and cracks 17 at the inner wall of the semicircular through-holes 5 at the time of cutting, which results in damaging the reliability. Further, since the volume of solder 7 used for soldering the base board 3 to the printed circuit board 1 is small, there arises a problem due to a lack in the reliability.

SUMMARY OF THE INVENTION

It is an object of this invention to provide a process for producing a base board with a special structure overcoming the defects of the prior art technique.

This invention provides a process for producing a base board which comprises:

forming through-holes in the predetermined portions in a base sheet, filling solder in the through-holes, and cutting the base sheet so as to give a plurality of base boards having semicircular through-holes filled with solder at side walls.

DESCRIPTION OF THE PREFERRED EMBODIMENTS

This invention is explained in detail referring to FIGS. 1 to 4.

Figure 1:
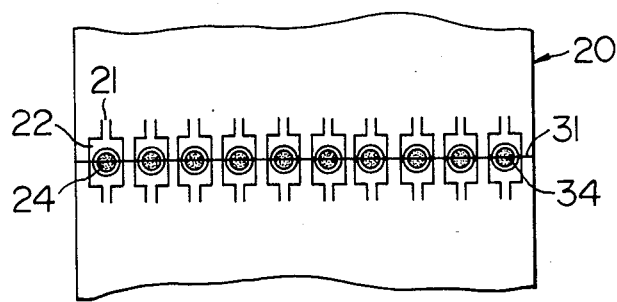
FIGS. 1 and 2 are plane views of base sheets according to this invention.

FIG. 1 is a plane view of a part of a base sheet 20 having predetermined circuits 21 to be connected to electronic parts (not shown in the drawing), lands 22 and through-holes 24. These circuits 21, lands 22 and through-holes 24 can be formed by a conventional method. As the material for the base sheet 20, there can be used glass reinforced thermosetting resins such as phenol resins, epoxy resins (e.g. those cured by using phenolic compounds, acid anhydrids, amines, imidazoles, etc.), polybutadiene resins, polyimide resins, etc.; glass reinforced thermoplastic resins such as polyester resins, polysulfone resins, polyphenylene oxide resins, etc. As the glass, there can be used not only glass cloth but also glass mat, glass cotton or glass paper covered with glass cloth.

The circuits and the lands can be formed, for example, by forming a plating resist layer on the base sheet and dipping the base sheet in a conventional electroless plating solution.

The base sheet 20 having predetermined through-holes is covered with a solder masking material except for the through-hole in order to prevent the adhesion of solder to undesired portion of the base sheet. Examples of the solder masking material are a solder resistant paper tape having a thickness of about 0.15 mm or more in the case of taping type masking, vinyl resins using polyesters as a plasticizer in the case of printing type masking, etc. The base sheet 20 is subjected to a solder flux treatment using a rosin series flux, an imidazole series flux, or an inorganic acid flux, and then subjected to semi-dried state at about 80° C. Then, the through-holes of the base sheet are filled with solder by a conventional dipping method, or wave soldering method.

The term "solder" includes a metal or alloy having a relatively low melting point, preferably 300° C. or lower, so as not to provide undesirable influence to the base sheet and printed circuit boards to be connected afterward as well as having a good workability for cutting, for example, alloys of Pb and Sn, alloys of Sn and Sb, alloys of Pb, Sn and Bi, etc.

When the soldering is over, the solder masking material is removed prior to cutting in usual.

Figure 3:
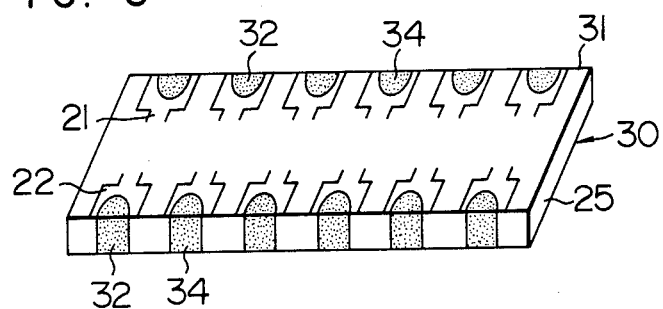
FIG. 3 is a perspective view of a base board according to this invention.

After filling the through-holes 24 with solder 34, the base sheet 20 is cut by using a cutter along the line 31 at the center portions of the through-holes 24 to give a plurality of base boards (or chip carriers) 30 shown in FIG. 3. Thus, a base board 30 having a plurality of semicircular through-holes 32 filled with solder entirely at side walls formed by the line 31 is obtained.

Figure 2:
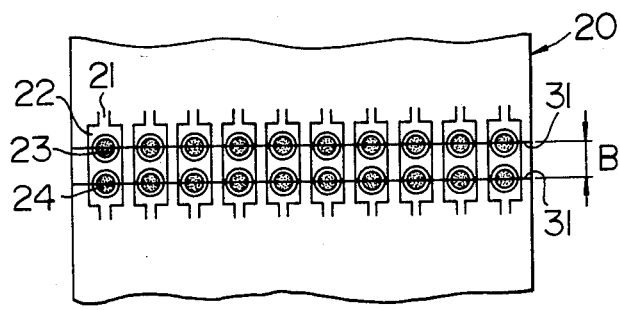

With a recent demand for miniaturization with high performance, pitches between through-holes become narrower and the diameter of through-holes becomes smaller. For example, the diameter of through-holes becomes 0.3 mm or less when applied to LSI. In such a case, the through-holes cannot be cut with a cutter having the blade thickness of 1 mm. Thus, two rows of through-holes 23 and 24 are formed with a pitch B (a distance between two centers of the through-holes 23 and 24) of 1 mm, filled with solder, and cut along the lines 31 as shown in FIG. 2 to give semicircular through-holes filled with solder at side walls formed along the lines 31. Needless to say, the pitch between a pair of through-holes can be taken properly depending on the blade thickness of the cutter. The formation of two rows of through-holes with a predetermined pitch is effective when the through-hole diameter becomes smaller, for example, smaller than the blade thickness of the cutter.

The above-mentioned explanation is made as to the circular through-holes, but the shape of the through-holes is not limited thereto. Through-holes in the form of an ellipse can also be used.

Further, the base board shown in FIG. 3 has the solder-filled semicircular through-holes at two opposite side walls, but this invention is not limited to such an embodiment. The base board of this invention may have solder-filled semicircular through-holes at three or four side walls.

Figure 4:
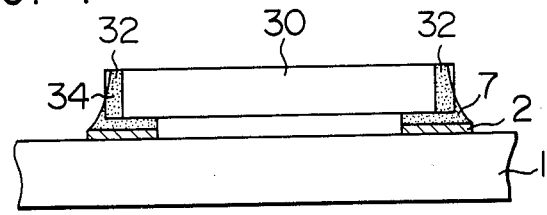
FIG. 4 is a schematic cross-sectional view of a printed wiring board formed by using the base board according to this invention.
Figure 5:
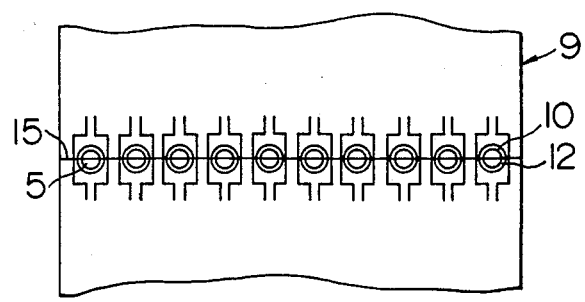
FIG. 5 is a plane view of a base sheet of prior art.
Figure 6:
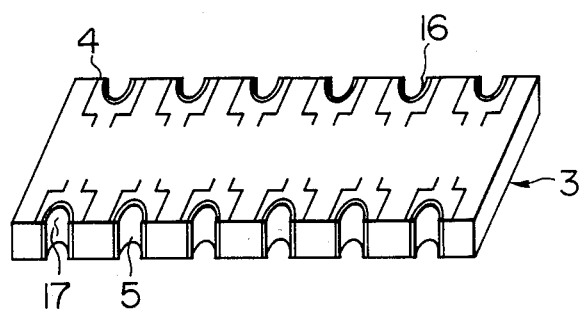
FIG. 6 is a perspective view of a base board of prior art.
Figure 7:
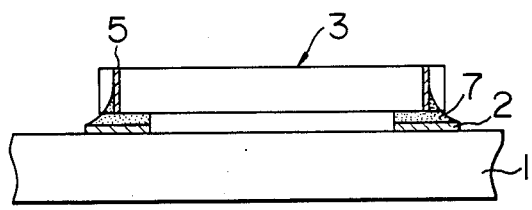
FIG. 7 is a schematic cross-sectional view of a printed wiring board of prior art.

In practical use of the base board of this invention, electronic parts are mounted on the circuits 21 of the base board 30, which is electrically connected to a printed circuit board 1 with solder 7 via the solder-filled semicircular through-holes to give a printed wiring board as shown in FIG. 4.

According to this invention, since through-holes in the base sheet are filled with solder, there take place no cracks on the through-hole inner walls, nor peeling of the inner coating of the through-holes at the time of cutting the base sheet to provide base boards. Further, since the semicircular through-holes at side walls are filled with solder, it is possible to make the fillet large at the time of connecting the base board to a printed circuit board, which results in enhancing the connection strength and thus improving the reliability.

What is claimed is:

1. A process for producing base boards for printed wiring boards which comprises:

forming through-holes in predetermined portions of a base sheet, filling solder in the through-holes, and cutting the base sheet to provide a plurality of adjacent base boards having semicircular through-holes filled with solder at side walls extending along adjacent base boards.

2. A process according to claim 1, wherein the cutting is conducted along a center line of a linear arrow of circular through-holes.

3. A process according to claim 1, wherein the through-holes are formed by at least two parallel rows of circular through-holes with a pitch between the centers of a pair of through-holes in adjacent rows being equal to that of the blade thickness of a cutter, and the cutting is conducted along the width of the pitch.

4. A process according to claim 1, wherein the base sheet is made from glass reinforced epoxy resin.

5. A process according to claim 1, wherein the base sheet is made from a glass reinforced thermoplastic resin or a glass reinforced thermoplastic resin.

6. A process according to claim 5, wherein the thermoplastic resin is a phenol resin, an epoxy resin a polybutadiene resin or a polyimide resin.

7. A process according to claim 5, wherein the thermoplastic resin is a polyester resin, a polysulfone resin, or a polyphenylene oxide resin.

8. A process according to claim 5, wherein the base sheet is made from a glass reinforced resin material

* * * * *